United States Patent [19]
Herring et al.

[11] Patent Number: 5,122,669
[45] Date of Patent: Jun. 16, 1992

[54] WIDEBAND SCHOTTKY FOCAL PLANE ARRAY

[75] Inventors: James R. Herring, San Marcus; James L. Gates, Vista, both of Calif.

[73] Assignee: Hughes Aircraft Company, Los Angeles, Calif.

[21] Appl. No.: 668,526

[22] Filed: Mar. 13, 1991

[51] Int. Cl.$^5$ ............... H01L 31/07; H01L 27/144
[52] U.S. Cl. .................. 250/370.14; 357/15; 357/30
[58] Field of Search ............. 357/30 C, 30 F, 15; 250/370.14

[56] References Cited

U.S. PATENT DOCUMENTS 3,071,057  7/1976  Connors et al. .............. 357/30 C
4,536,658  8/1985  Ludington .................... 250/578

OTHER PUBLICATIONS

W. F. Kosonocky, H. Elabd, H. G. Erhardt, F. V. Shallcross, G. M. Meray, R. Miller, T. S. Villani, J. V. Groppe, V. L. Frantz and F. J. Tams, "Schottky-Barrier Infrared Image Sensors", *RCA Engineer*, (May-Jun. 1982).

"A Wide Spectral Band Photodetector with PtSi/p-Si Schottky-Barrier" by M. Kimata et al., International Journal of Infrared and Millimeter Waves, vol. 6, No. 10, pp. 1031-1041 (1985).

"PtSi Schottky-Barrier Focal Plane Arrays for Multispectral Imaging in Ultraviolet, Visible. and Infrared Spectral Bands", by B. Tsaur, IEEE Electron Device Lett. (Apr./90).

*Primary Examiner*—Constantine Hannaher
*Attorney, Agent, or Firm*—W. C. Schubert; W. K. Denson-Low

[57] ABSTRACT

A radiation detector includes a silicon substrate (12) having opposing first and second major surfaces, the substrate absorbing visible radiation incident upon the first major surface and passing into the substrate for generating charge carriers therefrom. The detector further includes a silicide layer (16) overlying the second major surface of the substrate, the silicide layer forming a Schottky-barrier junction with the underlying substrate. The silicide layer absorbs IR radiation for generating charge carriers therefrom. The substrate has a resistivity of approximately one thousand ohms per centimeter or greater for enhancing responsivity to visible radiation. A cavity structure (16) overlies the silicide layer and has a reflector (18) optically coupled thereto for reflecting IR radiation that passes through the silicide layer back to the silicide layer. To further enhance responsivity the substrate is thinned and has a thickness within a range of approximately 25 microns to approximately 125 microns.

19 Claims, 1 Drawing Sheet

WIDEBAND SCHOTTKY FOCAL PLANE ARRAY

FIELD OF THE INVENTION

This invention relates generally to detectors of electromagnetic radiation and, in particular, to a backside illuminated array of Schottky-barrier photodetectors responsive to a wide spectral range of incident radiation.

BACKGROUND OF THE INVENTION

In U.S. Pat. No. 4,536,658, issued Aug. 20, 1985, entitled "Hybrid Schottky Infrared Focal Plane Array" C. E. Ludington discloses a hybrid assembly that includes a two dimensional focal plane array (FPA) of Schottky-barrier internal emission photodiodes. The array detects wavelengths longer than 1.0 micron; that is, radiation associated with the infrared (IR) spectrum. In an article entitled "A Wide Spectral Band Photodetector with PtSi/p-Si Schottky-Barrier" by M. Kimata et al., International Journal of Infrared and Millimeter Waves, vol. 6, no. 10, pages 1031–1041 (1985) there is disclosed a monolithic, Schottky-barrier FPA. The array includes a capability to sense, in addition to IR radiation, radiation having wavelengths less than 1.0 micron, including wavelengths associated with the visible spectrum. This additional capability is achieved by frontside illuminating the array, but at the expense of compromised IR performance. IR response is compromised for the reason that a resonant cavity structure is not provided.

In an article entitled "PtSi Schottky-Barrier Focal Plane Arrays for Multispectral Imaging in Ultraviolet, Visible, and Infrared Spectral Bands", by B. Tsaur et al., IEEE Electron Device Letters, vol. 11, no. 4, pages 162–164 (April 1990) there is also described a frontside illuminated array. This array also eliminates a frontside optical cavity structure. The article refers to a thinned Si substrate that is said could improve collection efficiency for carriers generated in the Si and which is said to have been employed in the fabrication of high-performance backside illuminated charge-coupled-device (CCD) imager arrays. The disadvantages of thinning the substrate include a lower fabrication yield and a greater susceptibility to surface recombination effects.

One disadvantage to such frontside illuminated devices of the prior art is that a fill-factor of the array is less than optimum. That is, these prior art Schottky-barrier arrays require that incident radiation pass through frontside metalization and also the silicide layer. As a result, some significant portion of the radiation that impinges on the frontside of the array is lost to reflection or is otherwise not available for generating detectable charge carriers.

It is an object of this invention to provide a backside illuminated Schottky-barrier photodetector that is responsive to a wide spectral range including both visible and infrared radiation and that achieves a fill-factor approaching 100 percent.

It is a further object of the invention to provide a backside illuminated Schottky-barrier photodetector that provides a high resistivity thinned silicon detector material for detecting wavelengths shorter than one micron and a silicide layer for detecting wavelengths longer than one micron, without sacrificing the beneficial effects provided by a frontside resonant cavity structure.

SUMMARY OF THE INVENTION

The foregoing and other problems are overcome and the objects of the invention are realized by a wideband, visible/infrared, silicide-based imager constructed in accordance with the invention.

A radiation detector includes a silicon substrate having opposing first and second major surfaces, the substrate absorbing visible radiation incident upon the first major surface and passing into the substrate for generating charge carriers therefrom. The detector further includes a silicide layer overlying the second major surface of the substrate, the silicide layer forming a Schottky-barrier junction with the underlying substrate. The silicide layer absorbs IR radiation for generating charge carriers therefrom The substrate has a resistivity of approximately one thousand ohms per centimeter or greater for enhancing responsivity to visible radiation. A cavity structure overlies the silicide layer and has a reflector optically coupled thereto for reflecting IR radiation that passes through the silicide layer back to the silicide layer. To further enhance responsivity the substrate is thinned and has a thickness within a range of approximately 25 microns to approximately 125 microns.

In operation, the application of a reverse bias potential causes a depletion region to extend from the silicide layer to, preferably, the backside surface of the high resistivity substrate. As a result, charge carriers generated anywhere within the thickness of the substrate, including charge carriers generated adjacent to the backside surface from the absorption of short wavelength radiation, are available for collection and detection.

Thus, the invention provides a silicide-based IR sensor that is also responsive to sun/moon illumination, sky glow, visible illuminators, visible exhaust signatures, and possibly UV signatures.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

Figure 1:
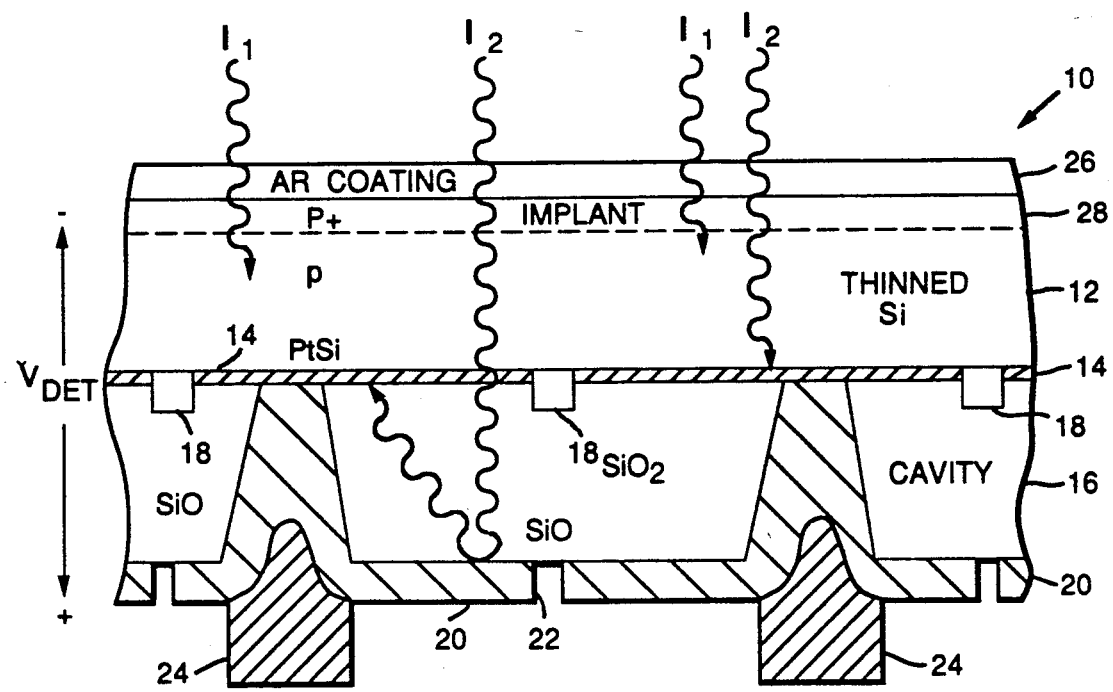
FIG. 1 is a cross-sectional view, not to scale, taken along the section line 1—1 of FIG. 2 and showing a radiation detector array constructed in accordance with the invention.
Figure 2:
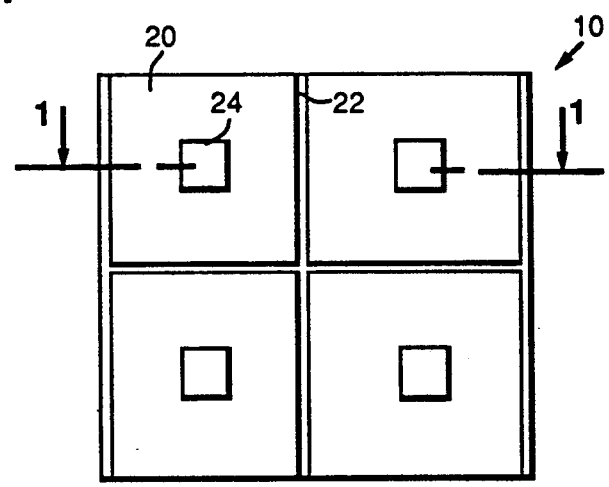
FIG. 2 is a top view of the array, also not drawn to scale.

Referring to FIGS. 1 and 2 there is shown a portion of a photodetector array 10 instructed in accordance with the invention. Although the array 10 is shown to have a two-by-two configuration it should be realized that the teaching of the invention extends to arrays having other configurations, such as linear arrays, and also extends to arrays having more or less than four photodetectors.

Array 10 includes a silicon body or substrate 12 comprised of, for example, p-type 100-Si. Substrate 12 is selected to have a resistivity that is substantially greater than that found in conventional Schottky barrier infrared detector arrays. In accordance with an aspect of the invention the resistivity of the silicon substrate 12 is selected to be in the range of approximately 1.0 Kohm-cm to approximately 10.0 Kohm-cm, as opposed to a range of 10–50 ohm-cm employed by conventional devices. As is described below, the use of high resistivity silicon is an important feature of the invention and serves to maximize a visible collection region and provide a high quantum efficiency over a wide spectral band.

Further in accordance with the invention the high resistivity silicon substrate 12 is thinned to a thickness of approximately 25 microns to approximately 125 microns from an initial thickness of approximately 400 microns or greater. This is in contradistinction to devices of the prior art that are known to be thinned to approximately five microns. Thinning of the substrate 12, in conjunction with the use of high resistivity silicon, serves to minimize recombination of charge carriers in non-active regions, that is, substrate regions that lie outside of a device depletion region. Thinning the high resistivity substrate also improves short wavelength visible and UV response.

A first major surface of the silicon substrate 12 is a radiation receiving surface, as indicated by the arrows designated $\lambda_1$ and $\lambda_2$. This radiation receiving surface is also referred to as a backside surface of the array 10, as opposed to an opposite frontside surface of the array whereon contact metalization and other structure is normally provided.

On a second major surface of the silicon substrate 12 there is formed a layer 14 of silicide, such as a layer of platinum silicide (PtSi). It should be realized however that other silicides, such as iridium silicide, may also be employed. The PtSi layer has a typical thickness of approximately 20 Angstroms to approximately 60 Angstroms and is formed by depositing a platinum film and subsequently heat treating the platinum film to produce PtSi. The interface of the PtSi layer 14 and the Si substrate 12 forms a Schottky-barrier junction. The silicide junction combination is responsive to radiation having wavelengths greater than approximately one micron, that is, wavelengths within the IR region. Overlying the PtSi layer 14 are a plurality of resonant cavity structures 16 each of which is comprised of a dielectric, such as SiO, and an overlying reflector 20. The cavity structures 16 have a thickness of approximately 1,000 Angstroms to approximately 6,000 Angstroms, with the thickness of the dielectric being selected, in a known manner, to optimize the performance of the array as a function of the wavelength of the IR radiation to be detected.

The array 10 is differentiated during fabrication into a mosaic of individual detector elements by insulating barriers 18 comprised of, for example, SiO$_2$. As can be seen, the barriers 18 electrically insulate regions of silicide one from another. Each region of silicide forms an individual detector element and has a typical dimension of approximately 20 to 50 microns on a side.

Forming a portion of the resonant cavity structures 16 is the layer of metalization 20 comprised of, for example, aluminum having a thickness of approximately 2,000 Angstroms. The aluminum layer 20 serves to electrically contact the PtSi layer 14 and also serves as an optical reflector for IR radiation that is not absorbed within the PtSi layer 14. A double-pass structure thus is provided by the Al reflector metal 20 and the underlying cavity 16 that functions to improve the quantum efficiency for infrared radiation. Openings 22 through the metalization layer 20 provide for electrically isolating individual ones of the detector elements from one another. Coupled to the metalization layer 20 are a plurality of electrical contacts, typically comprised of indium bumps 24, for coupling to external readout electronics (not shown).

An optional SiO anti-reflection (AR) coating 26 may be applied to the backside surface of the silicon substrate 12. The AR coating 26 has a thickness comparable to that of the cavity structures 16, or approximately 1,000 Angstroms to approximately 6,000 Angstoms, the thickness being selected, in a known manner, as a function of the wavelength of the IR radiation being detected.

An ion implanted p+ region 28 forms a backside ohmic contact and is substantially transparent to incident radiation. For example, the region 28 is implanted with boron to a concentration of approximately $10^{19}$ atoms cm$^{-3}$.

Figure 3:
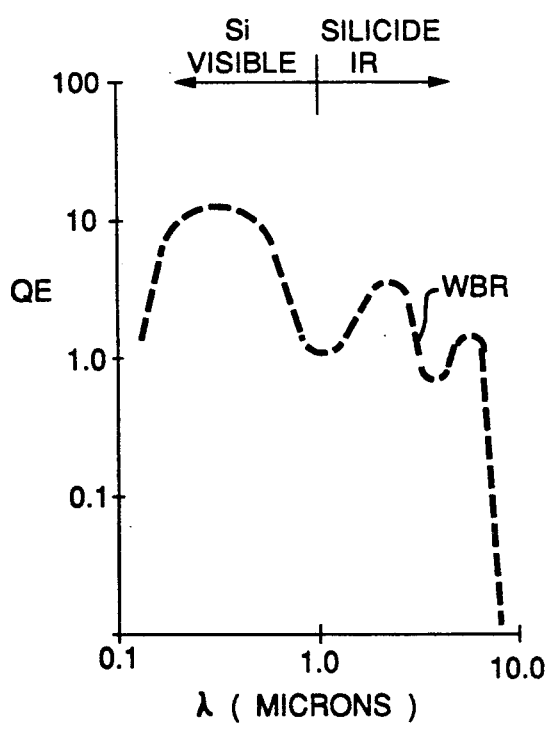
FIG. 3 is a graph illustrating the spectral responsivity of the array to a wide spectrum radiation input.

As depicted in the graph of FIG. 3, wherein quantum efficiency (QE) is plotted versus wavelength, the array 10 exhibits a significant absorption of radiation within the region below approximately one micron and also exhibits a significant absorption of radiation having wavelengths greater than approximately one micron. These two regions of the electromagnetic spectrum include wavelengths associated with the ultraviolet and visible regions, respectively, and with the short wave IR (SWIR) and medium wave IR (MWIR) spectral bands, respectively. The overall array wide band response (WBR) is shown as the dashed line.

As used herein UV radiation is considered to be electromagnetic radiation having wavelengths within a region of approximately 0.2 microns to approximately 0.4 microns. Visible radiation is considered to include a spectral region extending from approximately 0.4 microns to approximately 0.7 microns. SWIR radiation is considered to include a spectral region extending from approximately one micron to approximately four microns. MWIR radiation is considered to include a spectral region extending from approximately three microns to approximately eight microns while long wave IR (LWIR) radiation is considered to include a spectral region extending from approximately seven microns to approximately 10.4 microns.

Iridium silicide is one suitable constituent for the silicide layer 14 for detecting LWIR radiation.

In operation the application of a reverse bias potential ($V_{DET}$) causes a depletion region to extend from the silicide layer 14 to, preferably, the backside surface of the high resistivity substrate 12. As a result, charge carriers generated anywhere within the thickness of the substrate 12, including charge carriers generated adjacent to the backside surface from the absorption of short wavelength radiation, are available for collection and detection.

That is, UV and/or visible and/or IR radiation is incident on the backside of the detector array 10. UV radiation is absorbed closely adjacent to the back surface of the substrate 12 while visible radiation is absorbed at greater depths, the absorption depth being a function of wavelength. Photogenerated electrons are swept toward the silicide layer 14 in a drift field provided by $V_{DET}$. In accordance with an aspect of the invention a substantially 100% fill factor is achieved in that the entire back surface area of the silicon substrate 12 is photosensitive and, in that the depletion region may extend to the backside surface, substantially 100% of the substrate 12 volume is utilized.

The magnitude of $V_{DET}$ is a function of the resistivity and thickness of the Si substrate 12 and also a desired depth of the depletion region. Typical values range from approximately 2.0 volts to approximately 50 volts.

Test data taken on the array 10 constructed as above shows excellent MWIR performance with responsivity measured at 15 mV/° C., and good visible quantum efficiency measured at approximately 39% across the 0.3–0.75 micron spectral band. These values were obtained without the use of an AR coating 26 and, thus, can be expected to be improved.

Although described above in the context of a p-type 100-Si substrate other Si crystalline orientations can be employed. Also, the substrate 12 may be comprised of germanium or a germanium/silicon hybrid material. Thus, while the invention has been particularly shown and described with respect to a preferred embodiment thereof, it will be understood by those skilled in the art that changes in form and details may be made therein without departing from the scope and spirit of the invention.

What is claimed is:

1. A radiation detector comprising:
   a silicon substrate having opposing first and second major surfaces and a thickness within a range of approximately 25 microns to approximately 125 microns, the substrate absorbing radiation within a first spectral band that is incident upon the first major surface for generating charge carriers therefrom;
   a layer comprised of silicide disposed upon the second major surface of the substrate, the silicide layer forming a Schottky-barrier junction with the underlying substrate and absorbing radiation within a second spectral band for generating charge carriers therefrom; and wherein
   the substrate has a resistivity of approximately one thousand ohm centimeters or greater.

2. A radiation detector as set forth in claim 1 and further comprising a cavity structure overlying the layer and having reflector means optically coupled thereto for reflecting any radiation within the second spectral band that passes through the layer back to the layer for absorption therein.

3. A radiation detector as set forth in claim 1 and further comprising an antireflection coating disposed over the first major surface.

4. A radiation detector as set forth in claim 1 and further comprising an ion implanted region within the first major surface, the region forming an ohmic contact.

5. A radiation detector as set forth in claim 1 wherein the first spectral band includes wavelengths of less than approximately one micron and wherein the second spectral band includes wavelengths of greater than approximately one micron.

6. A radiation detector as set forth in claim 1 wherein the first spectral band includes wavelengths associated with at least the visible regions of electromagnetic spectrum and wherein the second spectral band includes wavelengths associated with the infrared region of the electromagnetic spectrum.

7. A radiation detector as set forth in claim 1 wherein the silicide layer is comprised of PtSi.

8. A radiation detector as set forth in claim 1 wherein the silicide layer is comprised of IrSi.

9. A radiation detector as set forth in claim 1 wherein the substrate is comprised of germanium.

10. An array of radiation detectors comprising:
    a substrate comprised of silicon having opposing first and second major surfaces, the substrate absorbing radiation having a wavelength of less than approximately one micron that is incident upon the first major surface for generating charge carriers therefrom;
    a layer comprised of silicide overlying the second major surface of the substrate, the silicide layer being differentiated into a plurality of silicide regions each of which forms a Schottky-barrier junction with the underlying substrate, each of the silicide regions absorbing radiation having a wavelength of greater than approximately one micron for generating charge carriers therefrom; and wherein the substrate has a resistivity of at least approximately one thousand ohm centimeters and a thickness of greater than approximately 25 microns and less than approximately 125 microns.

11. An array as set forth in claim 10 and further comprising a plurality of cavity structures overlying the layer and having reflector means optically coupled thereto for reflecting any radiation within the second spectral band that passes through the layer back to the layer for absorption therein.

12. An array as set forth in claim 10 and further comprising an antireflection coating disposed over the first major surface.

13. An array as set forth in claim 10 and further comprising an ohmic contact that is ion implanted region within the first major surface.

14. An array as set forth in claim 10 wherein the silicide layer is comprised of PtSi.

15. An array as set forth in claim 10 wherein the silicide layer is comprised of IrSi.

16. A method of fabricating an array of radiation detectors, comprising the steps of:
    providing a substrate comprised of silicon having opposing first and second major surfaces;
    forming a layer comprised of silicide over the second major surface of the substrate, the step of forming the silicide layer including a step of differentiating the silicide layer into a plurality of silicide regions each of which forms a Schottky-barrier junction with the underlying substrate; and
    forming a plurality of cavity structures overlying the layer and having reflector means optically coupled thereto for reflecting any radiation that passes through the layer back to the layer; and wherein
    the step of providing a substrate provides a substrate having a resistivity of approximately one thousand ohm centimeters or greater and a thickness of greater than approximately 25 microns and less than approximately 125 microns.

17. A method as set forth in claim 16 and further comprising a step of forming an antireflection coating over the first major surface.

18. A method as set forth in claim 16 and further comprising a step of ion implanting the first major surface with a dopant species selected for forming an ohmic contact.

19. A method as set forth in claim 16 wherein the step of forming a layer forms a layer comprised of PtSi or IrSi.

* * * * *